(12) United States Patent
Komoriyama et al.

(10) Patent No.: US 11,604,483 B2
(45) Date of Patent: Mar. 14, 2023

(54) CURRENT GENERATOR CIRCUIT AND DIAGNOSTIC CIRCUIT

(71) Applicant: Hitachi Automotive Systems, Ltd., Hitachinaka (JP)

(72) Inventors: Keishi Komoriyama, Ibaraki (JP); Minoru Migita, Ibaraki (JP); Yoichiro Kobayashi, Ibaraki (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 471 days.

(21) Appl. No.: 16/636,953

(22) PCT Filed: Jul. 17, 2018

(86) PCT No.: PCT/JP2018/026644
§ 371 (c)(1),
(2) Date: Feb. 6, 2020

(87) PCT Pub. No.: WO2019/054035
PCT Pub. Date: Mar. 21, 2019

(65) Prior Publication Data
US 2020/0363828 A1    Nov. 19, 2020

(30) Foreign Application Priority Data
Sep. 13, 2017  (JP) .............................. JP2017-175594

(51) Int. Cl.
*G01R 31/28*    (2006.01)
*G05F 3/26*    (2006.01)
(Continued)

(52) U.S. Cl.
CPC ............ *G05F 1/10* (2013.01); *G01R 19/0038* (2013.01); *G01R 31/2882* (2013.01); *H01F 7/064* (2013.01); *H03K 5/24* (2013.01)

(58) Field of Classification Search
CPC ......... G05F 1/10; G05F 3/26; G01R 19/0038; G01R 31/2882; H01F 7/064; H03K 5/24
See application file for complete search history.

(56) References Cited

U.S. PATENT DOCUMENTS 5,267,545 A * 12/1993 Kitson ................. H03K 17/166
123/490
6,044,019 A * 3/2000 Cernea ................ G11C 11/5621
365/207

(Continued)

FOREIGN PATENT DOCUMENTS

| JP | 2003-66904 A | 3/2003 |
| JP | 2017-147694 A | 8/2017 |

OTHER PUBLICATIONS www.vishay.com/docs/84810/change.pdf (Year: 2010).*

*Primary Examiner* — Nghia M Doan
(74) *Attorney, Agent, or Firm* — Crowell & Moring LLP

(57) ABSTRACT

The present invention maintains the accuracy of a reference current used in a functional circuit. Disclosed is a current generator circuit including a functional circuit and a diagnostic circuit. The functional circuit uses a reference current. The diagnostic circuit diagnoses the reference current in accordance with a comparison result obtained from comparison between the period of a periodic signal generated based on the reference current and the period of a reference clock inputted from the outside.

13 Claims, 10 Drawing Sheets

(51) Int. Cl.
  *G05F 1/10*   (2006.01)
  *G01R 19/00*  (2006.01)
  *H01F 7/06*   (2006.01)
  *H03K 5/24*   (2006.01)

(56) References Cited

U.S. PATENT DOCUMENTS

| | | | | |
|---|---|---|---|---|
| 6,130,632 | A | * | 10/2000 | Opris .................. H03M 1/1061 |
| | | | | 341/120 |
| 9,548,656 | B1 | * | 1/2017 | Wang ...................... H02M 1/15 |
| 2014/0152341 | A1 | | 6/2014 | Iyengar |
| 2017/0060165 | A1 | | 3/2017 | Kim et al. |
| 2017/0242451 | A1 | | 8/2017 | Yoshioka |

* cited by examiner

CURRENT GENERATOR CIRCUIT AND DIAGNOSTIC CIRCUIT

TECHNICAL FIELD

The present invention relates to a current generator circuit and a diagnostic circuit that are applicable to a functional circuit where a reference current is used.

BACKGROUND ART

Due, for instance, to high integration and miniaturization of semiconductor circuits, it is demanded that a reference current used in semiconductor circuits be highly accurate. Further, in a high-temperature environment where transistors, resistors, and other elements are likely to time-dependently deteriorate, it is difficult to maintain the accuracy of the reference current. Moreover, in some cases where a plurality of functional circuits are mounted, for example, in an electronic device, the time-dependent deterioration of the accuracy of the reference current inputted to the functional circuits changed from one functional circuit to another.

A method disclosed in Patent Document 1 reduces current changes occurring in a current mirror circuit by periodically switching between N+1 transistors acting as reference current sources, and by performing time-dependent averaging of current changes between all the N+1 transistors.

PRIOR ART DOCUMENT

Patent Document

Patent Document 1: JP-2003-66904-A

SUMMARY OF THE INVENTION

Problems to be Solved by the Invention

However, the method of performing time-dependent averaging of the current changes between transistors acting as reference current sources is not able to cope with the deterioration of the accuracy of the reference current due to the time-dependent deterioration of the accuracy of the reference current sources. Further, the method is not capable of coping with the time-dependent deterioration of the accuracy of reference currents individually inputted to a plurality of functional circuits.

The present invention has been made in view of the above circumstances. An object of the present invention is to provide a current generator circuit and a diagnostic circuit that make it possible to maintain the accuracy of a reference current used in a functional circuit.

Means for Solving the Problems

In accomplishing the above object, according to a first aspect of the present invention, there is provided a current generator circuit including a functional circuit and a diagnostic circuit. The functional circuit uses a reference current. The diagnostic circuit diagnoses the reference current in accordance with a result of comparison between a period of a periodic signal generated based on the reference current and a period of a reference clock inputted from an outside.

Advantages of the Invention

The present invention makes it possible to maintain the accuracy of a reference current used in a functional circuit.

MODES FOR CARRYING OUT THE INVENTION

Embodiments of the present invention will now be described with reference to the accompanying drawings. The embodiments described below do not limit the invention as defined by the scope of appended claims. Further, all elements described in conjunction with the embodiments and all combinations of the elements are not always essential to solutions provided by the invention.

Embodiment 1

Figure 1:
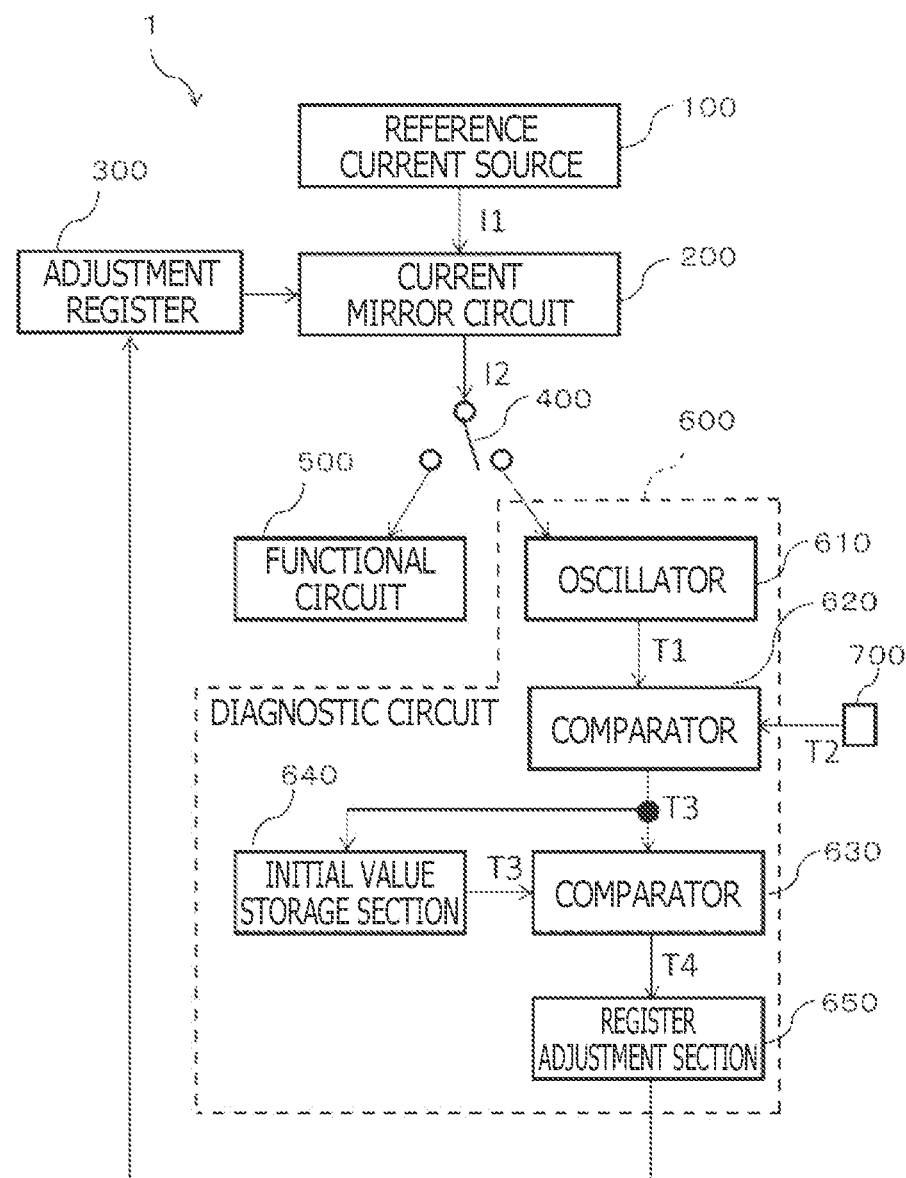
FIG. 1 is a block diagram illustrating a configuration of a current generator circuit according to Embodiment 1.

FIG. 1 is a block diagram illustrating a configuration of a current generator circuit according to Embodiment 1.

Referring to FIG. 1, the current generator circuit 1 includes a reference current source 100, a current mirror circuit 200, an adjustment register 300, a selector switch 400, a functional circuit 500, and a diagnostic circuit 600. The diagnostic circuit 600 is connected to a reference clock input section 700.

The reference current source 100 generates an upstream reference current I1. The current mirror circuit 200 generates a downstream reference current I2 in accordance with the reference current I1. The reference current I2 may be proportional to the reference current I1. The associated proportionality coefficient is changeable. The adjustment register 300 retains a register value that is capable of changing the proportionality coefficient of the current mirror circuit 200. The selector switch 400 switches the input destination of the reference current I2 between the functional circuit 500 and the diagnostic circuit 600.

The functional circuit 500 executes a specific function in accordance with the reference current I2. An error in the function executed by the functional circuit 500 depends on the accuracy of the reference current I2. An electronic circuit may be used as the functional circuit 500. The functional circuit 500 may be formed of a semiconductor circuit. The function to be executed may be an arithmetic function, a memory function, an amplification function, a conversion function, a detection function, a communication function, a control function, or other function.

The diagnostic circuit 600 diagnoses the reference current I2 in accordance with a comparison result T3 obtained by comparing the period T1 of a periodic signal generated based on the reference current I2 and the period T2 of a reference clock inputted from the outside. The reference clock input section 700 inputs the period T2 of the reference clock to the diagnostic circuit 600. The accuracy of the period T2 of the reference clock can be maintained higher than the accuracy of the period T1 of the periodic signal. In this instance, it is preferable that the accuracy of the period T2 of the reference clock not deteriorate time-dependently. The period T2 of the reference clock can be set within a range, for example, of 1 to 2 MHz.

The diagnostic circuit 600 includes an oscillator 610, comparators 620 and 630, an initial value storage section 640, and a register adjustment section 650.

The oscillator 610 generates a periodic signal in accordance with the reference current I2 used in the functional circuit 500, and inputs the period T1 of the generated periodic signal to the comparator 620. The period T1 can be expressed by the relational equation $T1=A/I2$ where A is a proportionality constant unique to the oscillator 610. In this instance, the period T1 and the reference current I2 can be uniquely associated with each other.

The comparator 620 compares the period T1 of the periodic signal with the period T2 of the reference clock, and output the comparison result T3 obtained from the comparison. The initial value storage section 640 stores, as an initial value, the comparison result T3 obtained from an initial comparison by the comparator 620. A NAND flash memory or other nonvolatile storage device may be used as the initial value storage section 640.

The comparator 630 compares comparison results T3 that are obtained at different time points by the comparator 620, and outputs a comparison result T4 obtained from the comparison. In this instance, the comparator 630 is able to compare the initial comparison result T3 stored in the initial value storage section 640 and a subsequent comparison result T3. The initial comparison result T3 may be stored in the initial value storage section 640 by a manufacturer before product shipment or stored in the initial value storage section 640 by a user after product shipment when, for example, a product is used for the first time.

The register adjustment section 650 adjusts the register value of the adjustment register 300 in accordance with the comparison result T4 outputted from the comparator 630. In this instance, when the comparison result T4 is assumed to be the difference between the initial comparison result T3 stored in the initial value storage section 640 and the subsequent comparison result T3, the register adjustment section 650 is able to adjust the register value of the adjustment register 300 in such a manner as to reduce the difference.

When, in the above instance, the period T2 of the reference clock is assumed to be constant, the changes in the reference current I2 are reflected in the period T1, and the changes in the period T1 are reflected in the comparison result T3. Therefore, when the register value of the adjustment register 300 is adjusted in such a manner as to reduce the difference between the initial comparison result T3 and the subsequent comparison result T3, the amount of change in the reference current I2 from its initial state is decreased. This makes it possible to maintain the accuracy of the absolute value of the reference current I2.

Figure 2:
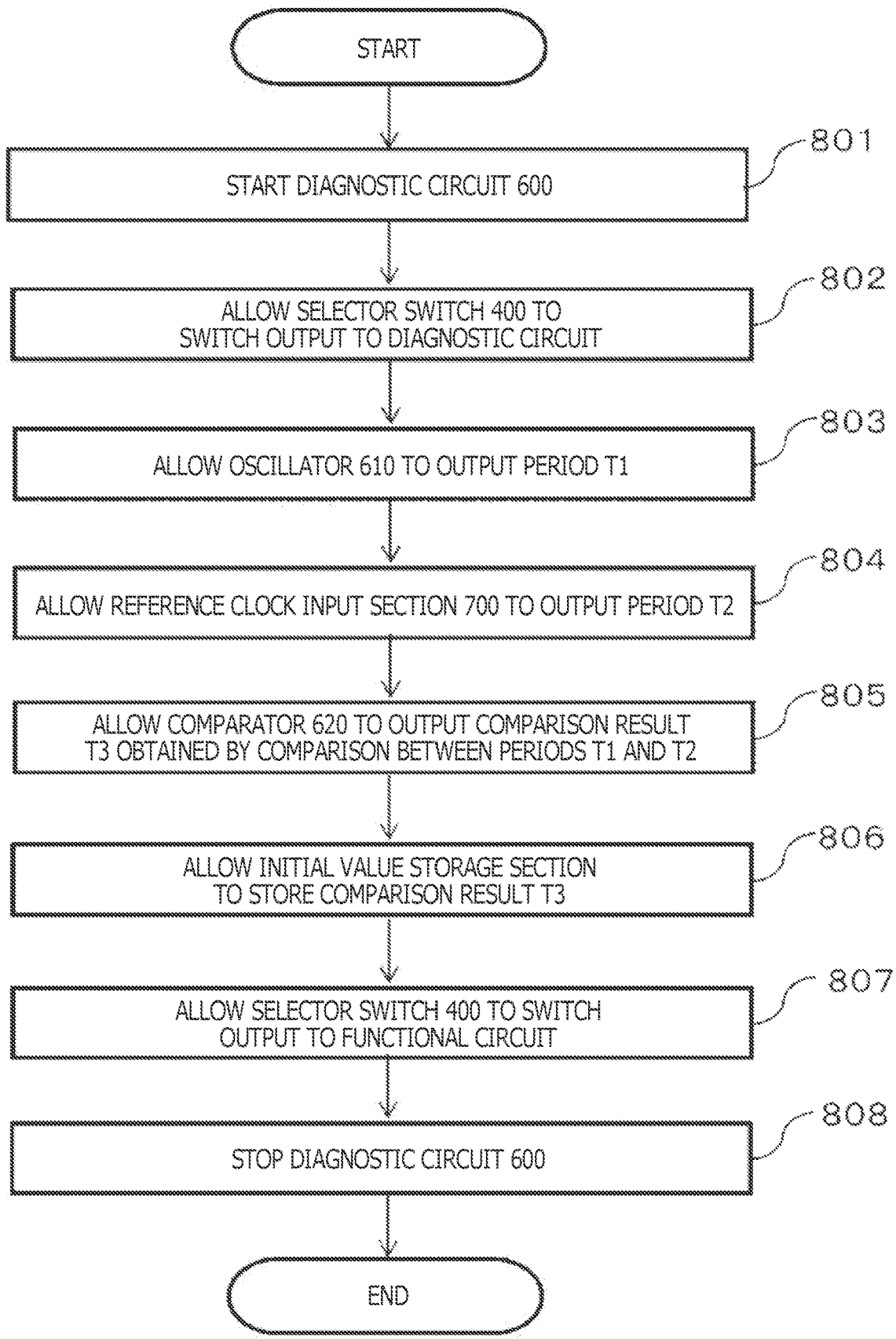
FIG. 2 is a flowchart illustrating an initial diagnosis operation of the current generator circuit according to Embodiment 1.

FIG. 2 is a flowchart illustrating an initial diagnosis operation of the current generator circuit according to Embodiment 1.

Referring to FIG. 2, the diagnostic circuit 600 starts (step 801). In this instance, it is possible to proceed to an initial diagnosis operation when the diagnostic circuit 600 starts for the first time. The diagnostic circuit 600 can be started, for example, immediately after the current generator circuit 1 is turned on. The diagnostic circuit 600 may be periodically started at predetermined intervals.

Next, the selector switch 400 switches its output to the diagnostic circuit 600 (step 802).

Next, the current mirror circuit 200 generates the reference current I2 in accordance with the reference current I1 generated by the reference current source 100, and outputs the generated reference current I2 to the oscillator 610. Next, the oscillator 610 generates a periodic signal in accordance with the reference current I2, and outputs the period T1 of the generated periodic signal to the comparator 620 (step 803).

Next, the reference clock input section 700 outputs the period T2 of the reference clock to the comparator 620 (step 804). The reference clock can be inputted to the diagnostic circuit 600 from the outside of the current generator circuit 1. For example, a communication signal clock may be used as the reference clock.

Next, the comparator 620 compares the period T1 of the periodic signal and the period T2 of the reference clock to obtain a comparison result T3, and outputs the obtained comparison result T3 (step 805). The ratio between the period T1 and the period T2 may be used as the comparison result T3. In such an instance, $T3=T2/T1$. The comparison result T3 may be retained as a log. The log can be used, for example, to predict a failure in the current generator circuit 1.

Next, the initial value storage section 640 stores, as an initial value, the comparison result T3 obtained by the comparator 620 (step 806).

Next, the selector switch 400 switches its output from the diagnostic circuit 600 to the functional circuit 500 (step 807).

Next, the diagnostic circuit comes to a stop (step 808).

The above-described initial diagnosis operation makes it possible to store the relative relationship between the initial reference current I2 and the period T2 in the initial value storage section 640. In this instance, the relationship expressed by the equations $T1=A/I2$ and $T3=T2/T1$ remains unchanged as far as the characteristics of the oscillator 610 and comparator 620 remain unchanged. Therefore, the relationship expressed by the equation $I2=A\times T3/T2$ is established so that the reference current I2 and the period T2 can be uniquely associated with each other.

Figure 3:
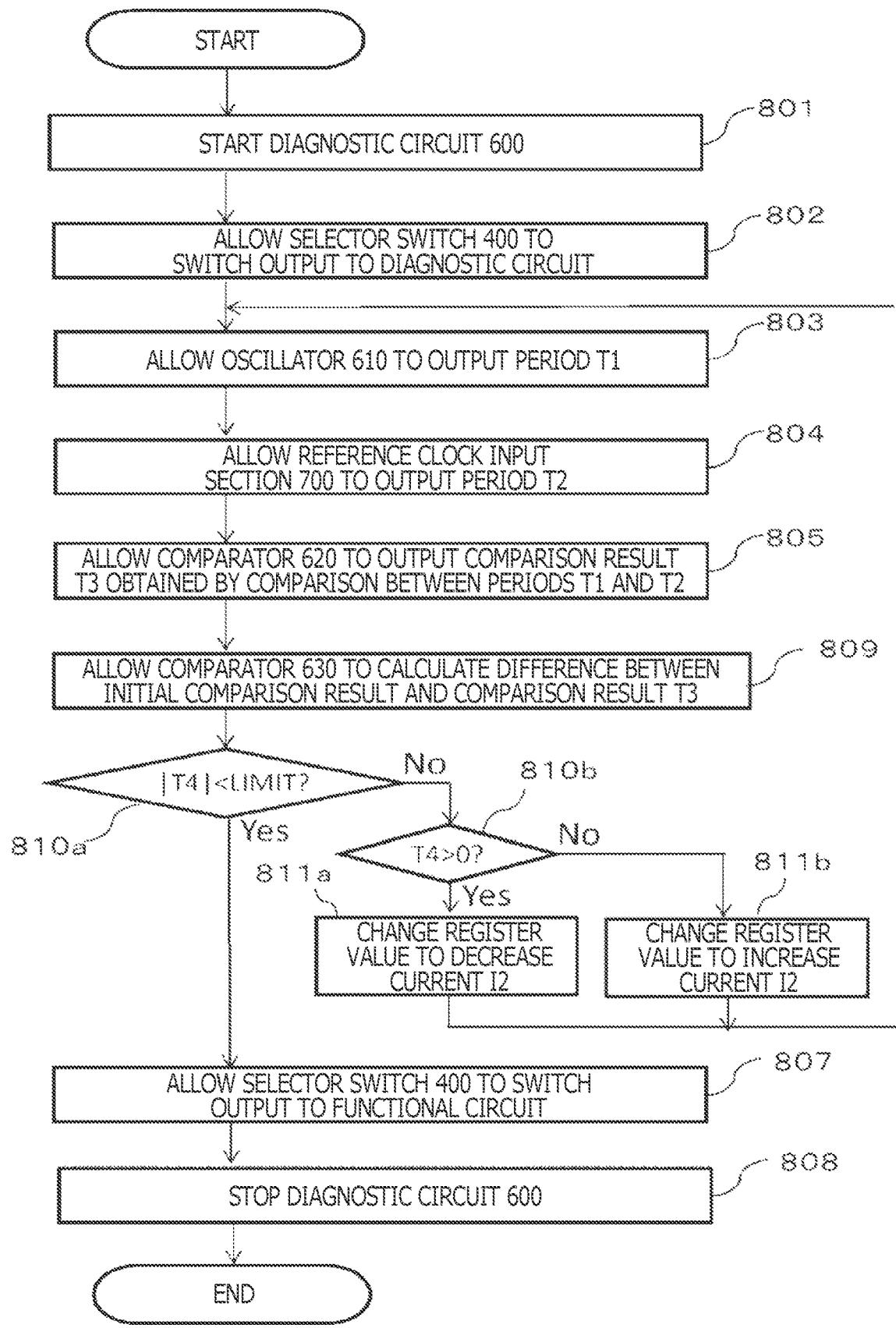
FIG. 3 is a flowchart illustrating a current adjustment operation of the current generator circuit according to Embodiment 1.

FIG. 3 is a flowchart illustrating a current adjustment operation of the current generator circuit according to Embodiment 1. The following description is given on the assumption that the period T2 of the reference clock is not changed since the initial diagnosis operation, and that the reference current I2 is increased by an amount of ΔI since the initial diagnosis operation and turned out to be I2×(1+ΔI).

Referring to FIG. 3, the diagnostic circuit 600 starts (step 801). In this instance, the diagnostic circuit 600 can proceed to the current adjustment operation when the diagnostic circuit 600 is started for a second or subsequent time.

Next, the selector switch 400 switches its output to the diagnostic circuit 600 (step 802).

Next, the current mirror circuit 200 generates the reference current I2×(1+ΔI) in accordance with the reference current I1 generated by the reference current source 100, and outputs the generated reference current I2×(1+ΔI) to the oscillator 610. Next, the oscillator 610 generates a periodic signal in accordance with the reference current I2×(1+ΔI), and outputs the period T1/(1+ΔI) of the generated periodic signal to the comparator 620 (step 803).

Next, the reference clock input section 700 outputs the period T2 of the reference clock to the comparator 620 (step 804).

Next, the comparator 620 compares the period T1/(1+ΔI) of the periodic signal and the period T2 of the reference clock to obtain a comparison result T3×(1+ΔI), and outputs the obtained comparison result T3×(1+ΔI) (step 805).

Next, the comparator 630 compares the comparison result T3 obtained from the initial diagnosis operation and the comparison result T3×(1+ΔI) obtained from a current diagnosis operation to obtain a comparison result T4, and outputs the obtained comparison result T4 (step 809). In this instance, when the comparison result T4 is assumed to be the difference between the comparison result T3 obtained from the initial diagnosis operation and the comparison result T3×(1+ΔI) obtained from the current diagnosis operation, the comparison result T4 is expressed by the equation T4=T3×(1+ΔI)−T3=T3×ΔI. In this case, the comparison result T4 may correspond to the amount of change in the reference current I2 from its initial state. The comparison result T4 may be used as a judgment criterion for increasing or decreasing the reference current I2.

Next, the register adjustment section 650 determines whether the comparison result T4 is within an allowable limit LIMIT (step 810a). More specifically, the register adjustment section 650 determines whether the absolute value of the comparison result T4 is within the allowable limit LIMIT. If the comparison result T4 is within the allowable limit LIMIT, processing proceeds to step 807.

Meanwhile, if the comparison result T4 is beyond the allowable limit LIMIT, the register adjustment section 650 determines whether T4>0 (810b). If T4>0, the reference current I2 is increased due to time-dependent deterioration. Therefore, the register adjustment section 650 adjusts the register value of the adjustment register 300 in such a manner as to decrease the reference current I2, and then returns to step 803 (step 811a). Meanwhile, if T4<0, the reference current I2 is decreased due to time-dependent deterioration. Therefore, the register adjustment section 650 adjusts the register value of the adjustment register 300 in such a manner as to increase the reference current I2, and then returns to step 803 (step 811b). In this instance, a predetermined fixed value may be used to increase or decrease the reference current I2 for adjustment purposes.

The value used to increase or decrease the reference current I2 may be set equivalent to the amount of change in the reference current I2 since the initial diagnosis operation. In such a case, processing may proceed to step 807 after the adjustment of the register value of the adjustment register 300 without returning to step 803.

Subsequently, steps 803 to 811a or steps 803 to 811b are repeated until the comparison result T4 is within the allowable limit LIMIT. When the comparison result T4 is within the allowable limit LIMIT, processing proceeds to step 807. Subsequently performed processing steps depicted in FIG. 3 are the same as the processing steps designated by the same reference characters in FIG. 2.

Due to the above-described current diagnosis operation, the comparison result T4 converges to |T4|<LIMIT. However, the comparison result T4 is the difference between the latest comparison result T3×(1+ΔI) and the comparison result T3 stored at the time of initial diagnosis. The reference current at the time of initial diagnosis is expressed by the equation I2=A×T3/T2. Therefore, when the reference current after the current diagnosis operation is assumed to be I2', it may be expressed by the equation I2'=A×(T3±LIMIT)/T2 or the equation I2'=A×T3/T2×(1±LIMIT/T3).

Here, the comparison result T3 is a fixed value and thus remains unchanged after initial diagnosis. Therefore, when the proportionality constant A and the period T2 remain unchanged, I2'=I2×(1±LIMIT/T3). In this case, the amount of change ΔI of the reference current I2 from its initial state, which has changed due to physical deterioration of elements ranging from the reference current source 100 to the current mirror circuit 200, can be controlled as desired to a value not greater than ±LIMIT/T3.

The adjustment resolution of the reference current I2' after the current diagnosis operation may be determined based on the minimum resolution setting selectable for the current mirror circuit 200.

Further, when the amounts of change in the proportionality constant A and period T2 are regarded as ΔA and ΔT2 (ΔA<<1, ΔT2<<1), respectively, and taken into consideration, I2'=I2×(1±ΔA) (1±LIMIT/T3)/(1±ΔT2). Therefore, the range of control of the amount of change ΔI of the reference current I2 from its initial state may be expressed as ±(ΔA+ΔT2+LIMIT/T3).

When, for example, LIMIT is set to be 1 while T3 is set to be approximately 2000, LIMIT/T3=0.05%. Further, for example, a system of in-vehicle control units uses the CAN (controller area network) protocol, the SPI (serial peripheral interface) protocol, or other protocol for unit-to-unit communication and IC-to-IC communication. A basic period used for such communication is based on the oscillation period of a crystal oscillator. For example, some in-vehicle crystal oscillators have a frequency deviation of ±100 ppm and an aging rate of ±5 ppm/year. In such a case, even when a 20-year operation is taken into consideration, error is approximately ±100 ppm (=0.01%), and ΔT2 is approximately 0.01%.

The amount of change ΔA in the proportionality constant A indicates the deterioration of the diagnostic circuit 600 itself. The deterioration is mainly caused by thermal stress and stress under bias conditions. The deterioration caused by the stress under bias conditions is substantially negligible as far as the diagnostic circuit 600 is turned off except at the time of diagnosis to limit the total diagnosis time during the whole life of a product. The deterioration caused by thermal stress is, for example, approximately ±0.2%.

In the above example, the range of control of the amount of change ΔI of the reference current I2 from its initial state is approximately ±0.3%. The amount of change is reduced as compared to the overall deterioration in the characteristics of the reference current source 100 and current mirror circuit 200. Particularly, in a case where the number of current mirror stages is large, the amount of change can be controlled within a predetermined range irrespective of the number of deterioration factors in the upstream and downstream of the reference current.

Embodiment 2

Figure 4:
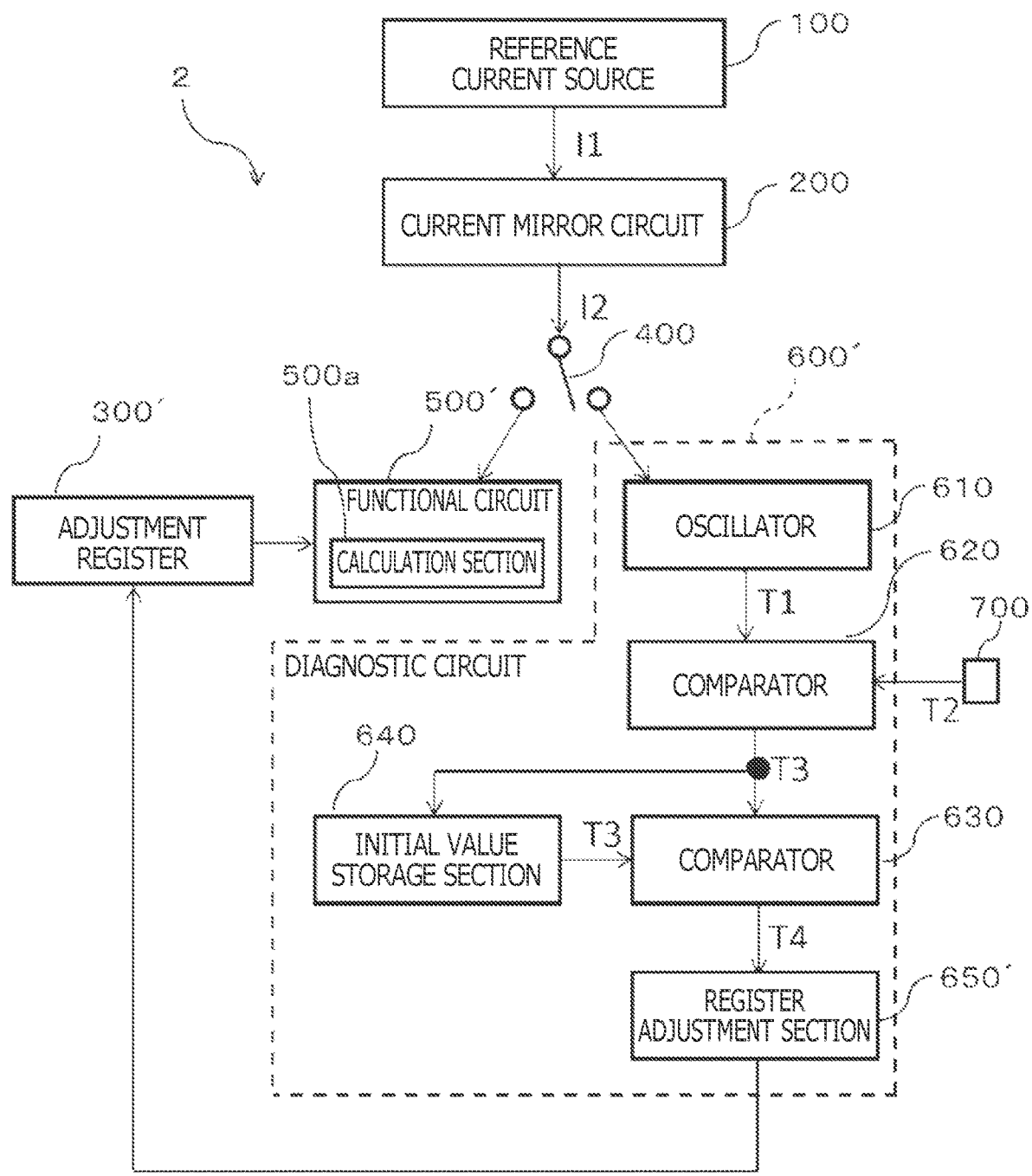
FIG. 4 is a block diagram illustrating a configuration of the current generator circuit according to Embodiment 2.

FIG. 4 is a block diagram illustrating a configuration of the current generator circuit according to Embodiment 2.

The current generator circuit 2 depicted in FIG. 4 includes an adjustment register 300', a functional circuit 500', and a diagnostic circuit 600' instead of the adjustment register 300, functional circuit 500, and diagnostic circuit 600 in FIG. 1, respectively.

The adjustment register 300' retains a register value that is capable of changing the coefficient of a calculation section 500a. The functional circuit 500' includes the calculation section 500a. The calculation section 500a performs calculations in accordance with the reference current I2. The calculations may be, for example, multiplications and divisions. The diagnostic circuit 600' includes a register adjustment section 650' instead of the register adjustment section 650. The register adjustment section 650' adjusts the register value of the adjustment register 300' in accordance with the comparison result T4 outputted from the comparator 630. In this instance, when the comparison result T4 is assumed to be the difference between the initial comparison result T3 stored in the initial value storage section 640 and the subsequent comparison result T3, the register adjustment section 650' is able to adjust the register value of the adjustment register 300' in such a manner as to offset the difference.

Here, adjusting the register value of the adjustment register 300' makes it possible to change the coefficient of the calculation section 500a in such a manner as to offset the change in the reference current I2 from its initial state. Consequently, the operating accuracy of the functional circuit 500' can be maintained.

Figure 5:
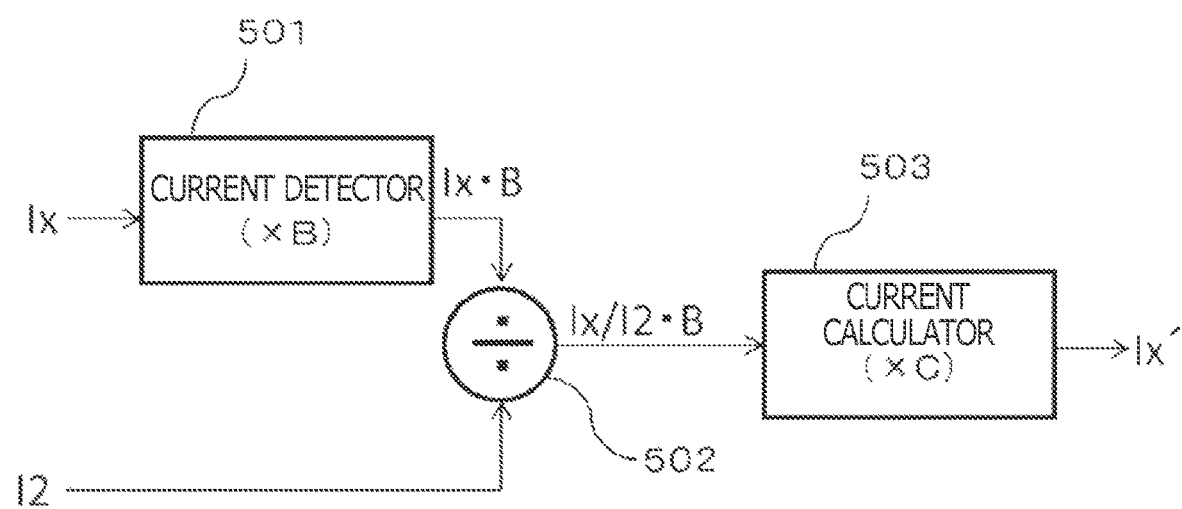
FIG. 5 is a block diagram illustrating an exemplary configuration of a calculation section depicted in FIG. 4.

FIG. 5 is a block diagram illustrating an exemplary configuration of the calculation section depicted in FIG. 4.

Referring to FIG. 5, the calculation section 500a includes a current detector 501, a current comparator 502, and a current calculator 503.

The current detector 501 monitors a current Ix used in the functional circuit 500'. For example, a current sensor may be used as the current detector 501. When the characteristics of the current detector 501 are expressed by a linear function, and the proportionality coefficient unique to the current detector 501 is B, the current detector 501 outputs a current of Ix×B.

The current comparator 502 compares the output Ix×B from the current detector 501 and the reference current I2 inputted to the functional circuit 500'. This allows the current comparator 502 to output a value of Ix×B/I2 as a comparison result. In this instance, the current comparator 502 may use a divider.

The current calculator 503 determines a current detection value Ix' by multiplying the comparison result outputted from the current comparator 502 by a correction coefficient. When the correction coefficient is C, the current detection value Ix' may be expressed as Ix×B×C/I2. If, in this instance, the correction coefficient C is set so as to satisfy the equation B×C/I2=1, the current detection value Ix' can be made equal to the current Ix monitored by the current detector 501.

When it is assumed that the reference current I2 in the above-described configuration is changed by ΔI from the initial state and turned out to be I2×(1+ΔI) while the correction coefficient C is fixed, the current detection value Ix' changes by 1/(1+ΔI).

Meanwhile, when the reference current I2 is changed by an amount of ΔI from the initial state, the change in the current detection value Ix' can be offset by changing the correction coefficient C by the same amount as the amount of change in the current detection value Ix'. Therefore, even in a case where the reference current I2 is changed from its initial state, the current detection value Ix' can be made equal to the current Ix monitored by the current detector 501.

Figure 6:
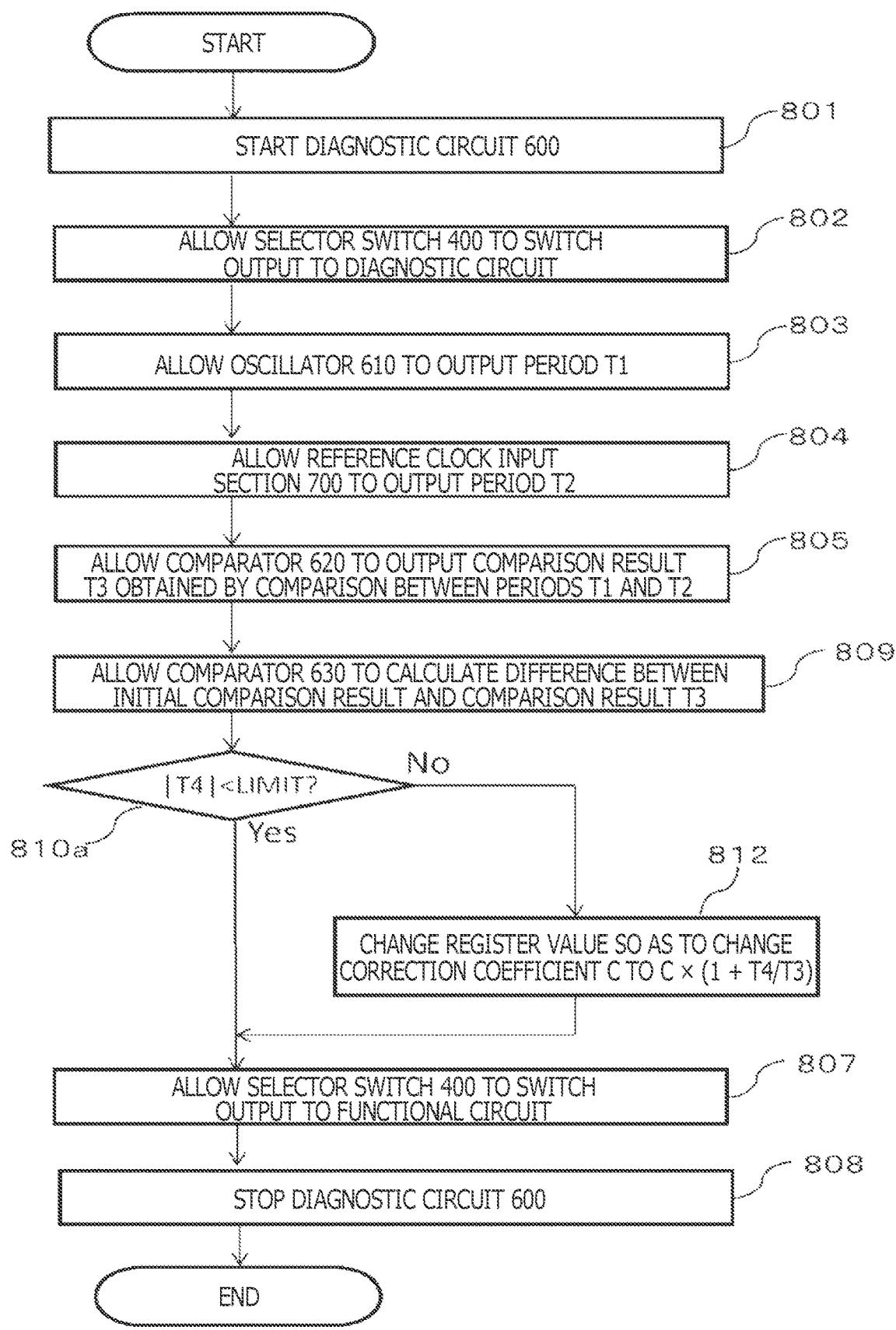
FIG. 6 is a flowchart illustrating a current adjustment operation of the current generator circuit according to Embodiment 2.

FIG. 6 is a flowchart illustrating a current adjustment operation of the current generator circuit according to Embodiment 2. Processing steps designated by the same reference characters as those in FIG. 3 are identical with the corresponding steps in FIG. 3 and will not be redundantly described.

Referring to FIG. 6, if the comparison result T4 is beyond the allowable limit LIMIT (step 810a), the change 1/(1+ΔI) in the current detection value Ix' is offset by multiplying the correction coefficient C by (1+ΔI).

More specifically, as described with reference to the flowchart of FIG. 3, ΔI=T4/T3 because T4=T3×ΔI. Therefore, if the comparison result T4 is beyond the allowable limit LIMIT (step 810a), the register value of the adjustment register 300' is changed so as to multiply the correction coefficient C by (1+T4/T3) (step 812). Upon completion of step 812, processing proceeds to step 807.

When the method of multiplying the correction coefficient C by (1+T4/T3) is adopted, the change 1/(1+ΔI) in the current detection value Ix' can be offset by applying a single change to the correction coefficient C. Therefore, it is not necessary to return to step 803 after the register value of the adjustment register 300' is changed. Consequently, the above method makes the processing steps simpler than the method depicted in FIG. 3.

Further, the method depicted in FIG. 6 adjusts numerical data on the correction coefficient C that is used for logical calculation. The numerical data is stored as digital data. Therefore, the adjustment resolution can be increased by increasing the number of bits of the numerical data on the correction coefficient C. Consequently, excellent extensibility is obtained as compared to the adjustment of the current mirror circuit 200 whose element shape is restricted because physical characteristics need to be accurate.

Embodiment 3

Figure 7:
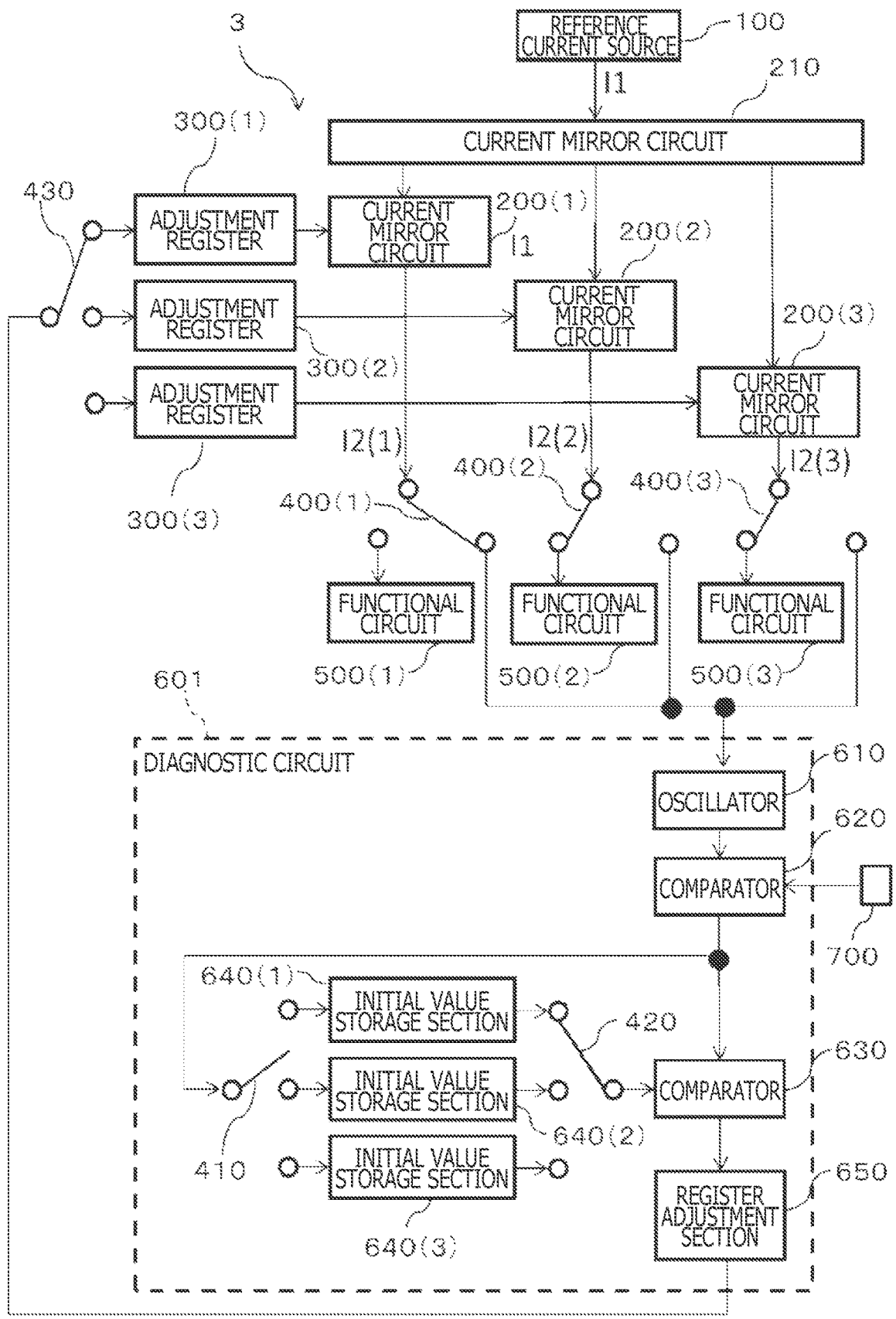
FIG. 7 is a block diagram illustrating a configuration of the current generator circuit according to Embodiment 3.

FIG. 7 is a block diagram illustrating a configuration of the current generator circuit according to Embodiment 3.

Referring to FIG. 7, the current generator circuit 3 includes a reference current source 100, current mirror circuits 210 and 200(1) to 200(3), adjustment registers 300(1) to 300(3), selector switches 400(1) to 400(3), a selector 430, functional circuits 500(1) to 500(3), and a diagnostic circuit 601. The diagnostic circuit 601 is connected to the reference clock input section 700.

The current mirror circuits 200(1) to 200(3), the adjustment registers 300(1) to 300(3), and the selector switches 400(1) to 400(3) are disposed in association with the corresponding functional circuits 500(1) to 500(3). The functional circuits 500(1) to 500(3) may have the same or different functions.

The current mirror circuit 210 generates reference currents I2(1) to I2(3) for the respective current mirror circuits 200(1) to 200(3) in accordance with the reference current I1. The selector 430 selects one of the adjustment registers 300(1) to 300(3) as an input destination.

The diagnostic circuit 601 diagnoses the reference currents I2(1) to I2(3) in accordance with the comparison result T3 obtained by comparing the period T1 of the periodic signal generated based on the reference currents I2(1) to I2(3) and the period T2 of a reference clock inputted from the outside. The diagnostic circuit 601 may be disposed as a circuit common to the functional circuits 500(1) to 500(3).

The diagnostic circuit 601 includes an oscillator 610, comparators 620 and 630, initial value storage sections 640(1) to 640(3), the register adjustment section 650, and selectors 410 and 420. The initial value storage sections 640(1) to 640(3) are disposed in association with the functional circuits 500(1) to 500(3). The selector 410 selects one of the initial value storage sections 640(1) to 640(3) as an input destination. The selector 420 selects one of the initial value storage sections 640(1) to 640(3) as an output source.

As the functional circuits 500(1) to 500(3) share the single diagnostic circuit 601, it is possible to maintain the accuracy of the absolute values of the reference currents I2(1) to I2(3) and provide the reference currents I2(1) to I2(3) having the same value. Therefore, in a case where functional circuits having the same functions are provided for a plurality of channels, it is possible to reduce changes in the reference currents I2(1) to I2(3) from the initial state and suppress inter-channel variation of the deterioration of characteristics.

The configuration depicted in FIG. 7 assumes that three functional circuits 500(1) to 500(3) are included. However, embodiment 3 is applicable to a case where N functional circuits are included (N is an integer of 2 or greater).

Further, the configuration depicted in FIG. 7 assumes that the adjustment method adopted for the current mirror circuits 200(1) to 200(3) is the same as described in conjunction with the configuration depicted in FIG. 1. However, the same adjustment method as described in conjunction with the configuration depicted in FIG. 4 may be adopted for the functional circuits 500(1) to 500(3). Another alternative is to adopt the same adjustment method for the current mirror circuits 200(1) to 200(3) as described in conjunction with the configuration depicted in FIG. 1 while adopting the same adjustment method for the functional circuits 500(1) to 500(3) as described in conjunction with the configuration depicted in FIG. 4.

Figure 8:
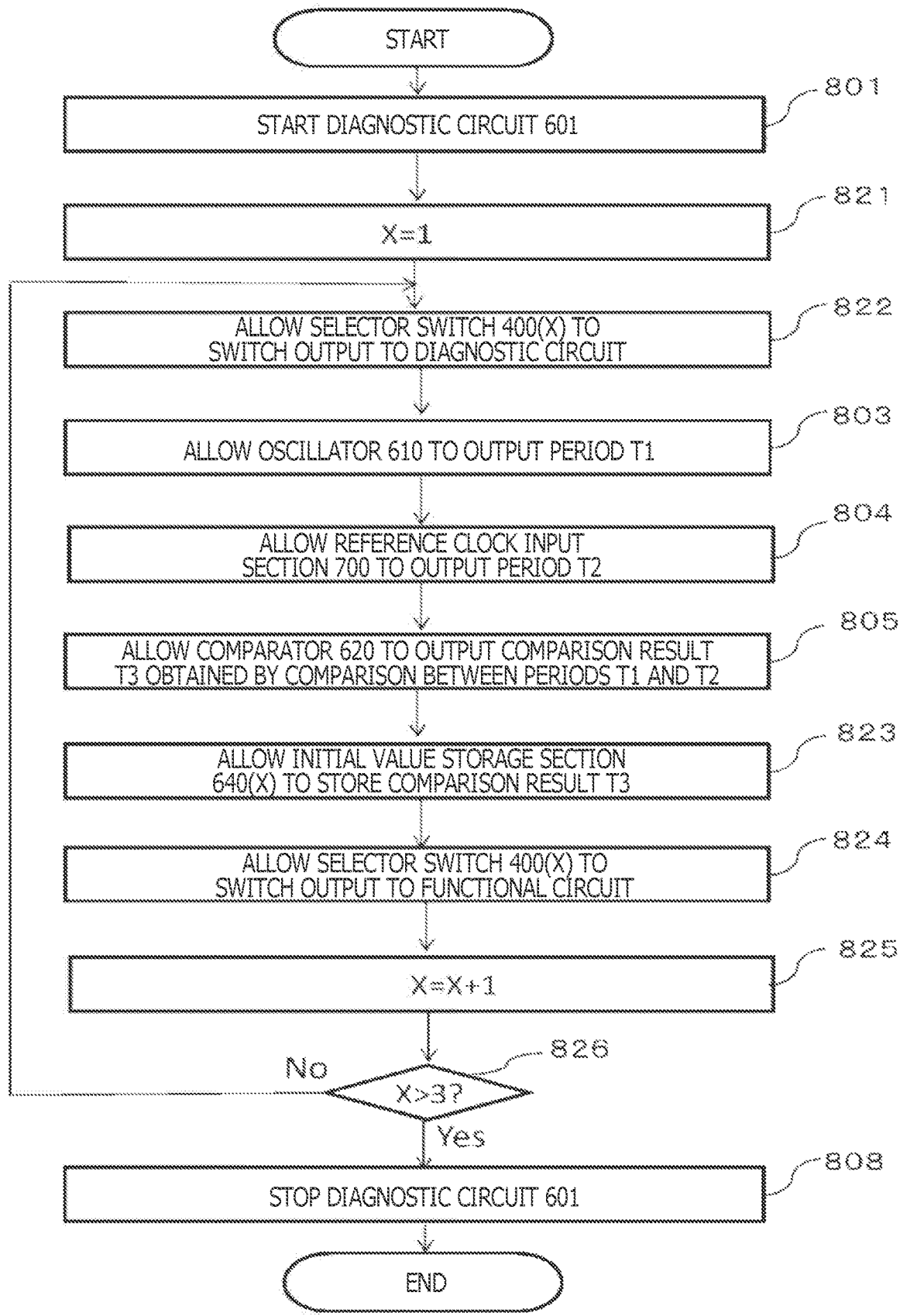
FIG. 8 is a flowchart illustrating an initial diagnosis operation of the current generator circuit according to Embodiment 3.

FIG. 8 is a flowchart illustrating an initial diagnosis operation of the current generator circuit according to Embodiment 3. Processing steps designated by the same reference characters as those in FIG. 2 are identical with the corresponding steps in FIG. 2 and will not be redundantly described.

In the processing described in FIG. 8, the reference currents I2(1) to I2(3) used in the functional circuits 500(1) to 500(3) are sequentially inputted to the diagnostic circuit 601 in order to process the reference currents I2(1) to I2(3) in the same manner as depicted in FIG. 2.

More specifically, when the diagnostic circuit 601 starts, X is set to 1 (X=1). Therefore, a first functional circuit 500(X) is selected (step 821). However, X is a number for identifying the functional circuits 500(1) to 500(3). As the configuration depicted in FIG. 7 includes three functional circuits 500(1) to 500(3), one of the numbers from 1 to 3 is substituted into X.

Next, the selector switch 400(X) switches its output to the diagnostic circuit 601 (step 822).

Next, steps 803 to 805 are performed.

Next, the initial value storage section 640(X) stores the comparison result T3 obtained by the comparator 620 as an initial value (step 823).

Next, the selector switch 400(X) switches its output from the diagnostic circuit 601 to the functional circuit 500(X) (step 824).

Next, the diagnostic circuit 601 increments X by one (step 825), and then determines whether X>3 (step 825). If X is not greater than 3 (X≯3), processing returns to step 822, and steps 822 to 826 are repeated until X>3. When X>3, processing proceeds to step 808.

FIG. 8 illustrates the initial diagnosis operation of the current generator circuit 3 depicted in FIG. 7. However, the current adjustment operation can be implemented by sequentially inputting the reference currents I2(1) to I2(3) used in the functional circuits 500(1) to 500(3) to the diagnostic circuit 601 and processing the reference currents I2(1) to I2(3) in the same manner as depicted in FIG. 3.

Embodiment 4

Figure 9:
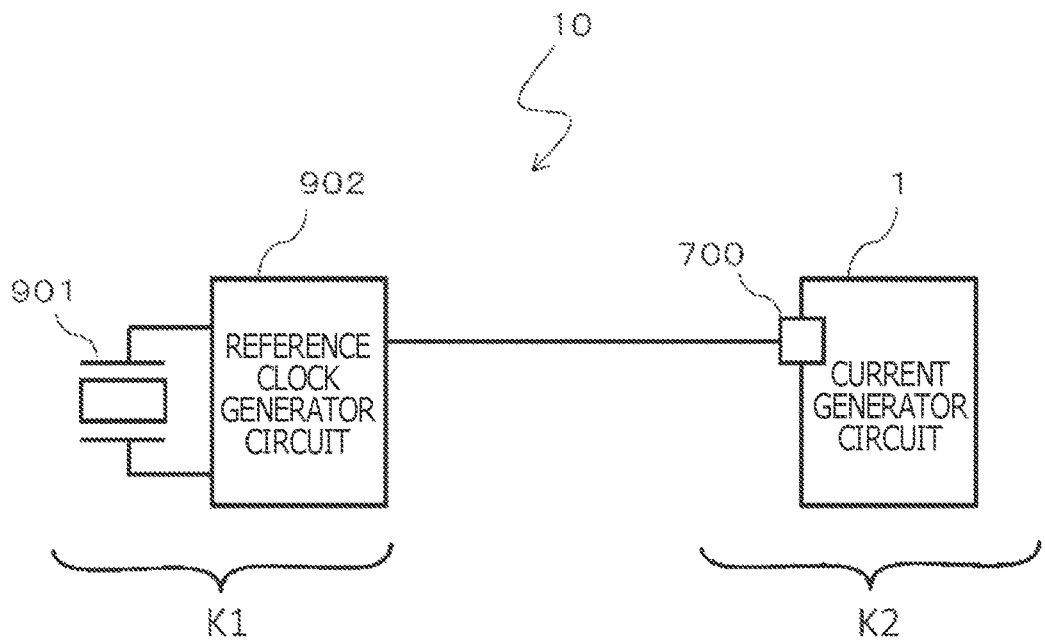
FIG. 9 is a block diagram illustrating a configuration of a diagnostic system that uses the current generator circuit according to Embodiment 4.

FIG. 9 is a block diagram illustrating a configuration of a diagnostic system that uses the current generator circuit according to Embodiment 4.

Referring to FIG. 9, the diagnostic system 10 includes the current generator circuit 1 and a reference clock generator circuit 902. The current generator circuit 1 is connected to the reference clock generator circuit 902 through the reference clock input section 700. The reference clock generator circuit 902 is connected to an oscillator 901.

The oscillator 901 generates a periodic signal that acts as the source for the reference clock. The reference clock generator circuit 902 generates the reference clock in accordance with the periodic signal generated by the oscillator 901, and outputs the generated reference clock to the reference clock input section 700. If the reference clock generated by the reference clock generator circuit 902 has a high frequency, a frequency-divided signal may be obtained by frequency-dividing the reference clock generated by the reference clock generator circuit 902 and inputted to the reference clock input section 700.

The current generator circuit 1 and the reference clock generator circuit 902 may be installed at a physical distance from each other. In this case, thermal stress in an installation environment K1 for the oscillator 901 and the reference clock generator circuit 902 can be made lower than thermal stress in an installation environment K2 for the current generator circuit 1. A highly thermally stressed environment may be, for example, a high-temperature environment, an environment subjected to large temperature changes, or an environment exhibiting short temperature change periods.

Accordingly, when the oscillator 901 and the reference clock generator circuit 902 are installed in the installation environment K1 where thermal stress is low, it is possible to reduce the time-dependent deterioration of the accuracy of the period T2 of the reference clock.

The configuration depicted in FIG. 9 assumes that the diagnostic system 10 uses the current generator circuit 1 depicted in FIG. 1. However, the diagnostic system 10 may alternatively use the current generator circuit 2 depicted in FIG. 4 or the current generator circuit 3 depicted in FIG. 7.

Embodiment 5

Figure 10:
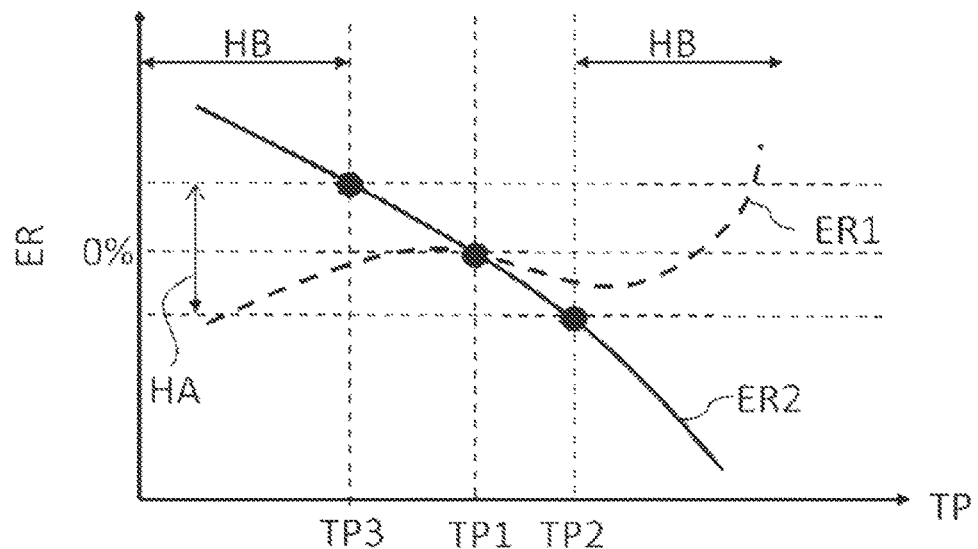
FIG. 10 is a diagram illustrating the temperature dependence of periodic error of a reference clock used in the current generator circuit according to Embodiment 5.

FIG. 10 is a diagram illustrating the temperature dependence of periodic error of a reference clock used in the current generator circuit according to Embodiment 5.

In the diagnostic system 10 depicted in FIG. 9, the characteristics of the current generator circuit 1 and reference clock generator circuit 902 are temperature-dependent. Therefore, when the ambient temperature is assumed to be TP1 during the initial diagnosis operation as depicted in FIG. 10, an error ER1 and an error ER2 occur respectively in the period T2 of the reference clock and the diagnostic circuit 600 at an ambient temperature other than TP1.

In the above case, the error ER2 may become excessively large due to the difference in ambient temperature between an initial diagnosis operation and a subsequent diagnosis operation. Consequently, the result of diagnosis may not achieve desired accuracy. Therefore, an allowable range HA is set for the error ER2 in such a manner that the result of diagnosis achieves the desired accuracy. This makes it possible to regard an upper-limit ambient temperature within the allowable range HA as TP2, regard a lower-limit ambient temperature within the allowable range HA as TP3, and set a diagnosis prohibition range HB that represents ambient temperatures equal to or higher than TP2 and ambient temperatures equal to or lower than TP3.

Consequently, it is possible to make diagnosis within a predetermined ambient temperature range that allows the result of diagnosis to achieve the desired accuracy, and improve the reproducibility of initial characteristics of the diagnostic circuit 600.

Embodiment 6

Figure 11:
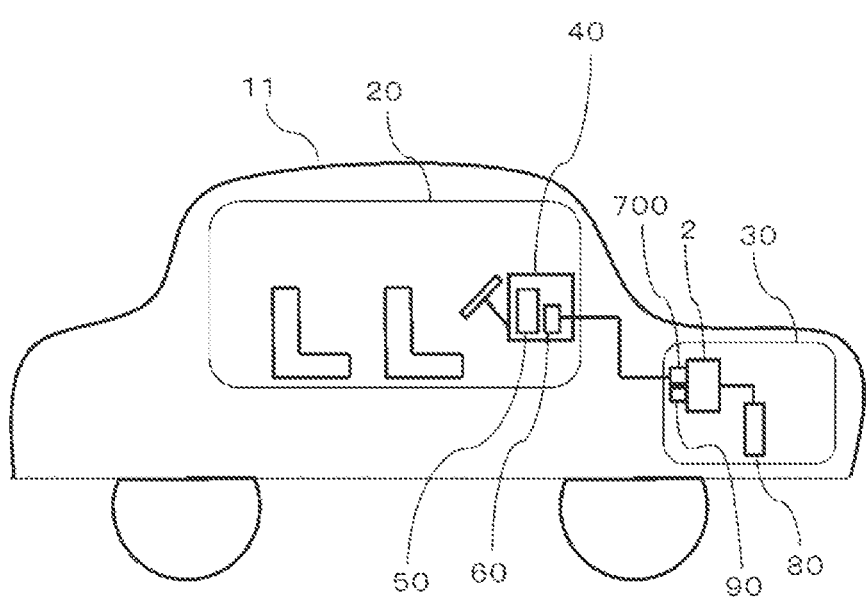
FIG. 11 is a block diagram illustrating a configuration of the diagnostic system that uses the current generator circuit according to Embodiment 6.

FIG. 11 is a block diagram illustrating a configuration of the diagnostic system that uses the current generator circuit according to Embodiment 6.

Referring to FIG. 11, a vehicle 11 includes an interior space 20 and an engine compartment 30.

A dashboard 40 is disposed in the interior space 20. A display device 50 and a communication device 60 are mounted on the dashboard 40. The display device 50 is capable of displaying, for example, a speedometer, a map, navigation information, and traffic jam information. The communication device 60 is capable of establishing unit-to-unit communication between in-vehicle control units and establishing IC-to-IC communication. The communication device 60 may alternatively be capable of receiving, for example, navigation information and traffic jam information.

The engine compartment 30 includes the current generator circuit 2, the reference clock input section 700, a solenoid 80, and a temperature sensor 90. The solenoid 80 can be used, for example, to exercise hydraulic pressure switching control for automatic transmission shifting and injector valve opening control of a fuel injection device. The temperature sensor 90 can be disposed in proximity to the current generator circuit 2. The reference clock used for the communication device 60 can be inputted to the reference clock input section 700.

The current generator circuit 2 includes a solenoid driver and a detector. The solenoid driver drives the solenoid 80. The detector detects a drive current outputted from the solenoid driver. The detector may have the same configuration as depicted in FIG. 5. In such a case, the drive current outputted from the solenoid driver can be used as the current Ix depicted in FIG. 5.

Here, even in a case where the reference current I2 has changed, the diagnostic circuit 600' depicted in FIG. 4, which is disposed in the current generator circuit 2, is able to make the drive current outputted from the solenoid driver coincide with the current detection value Ix' by referencing the period T2 of the reference clock outputted from the communication device 60.

Here, using the reference clock outputted from the communication device 60 installed in the interior space 20 makes it possible to prevent the communication device 60 from being exposed to high temperature during an engine operation and reduce the time-dependent deterioration of the accuracy of the period T2 of the reference clock.

The diagnostic circuit 600 is able to reference the temperature that is detected by the temperature sensor 90 during a diagnosis operation. When the temperature detected by the temperature sensor 90 is within the diagnosis prohibition range HB depicted in FIG. 10, the diagnostic circuit 600 is able to prohibit diagnosis. In such a case, the diagnostic circuit 600 is able to perform a diagnosis operation before the engine warms up immediately after engine startup.

The configuration depicted in FIG. 11 assumes that the diagnostic system uses the current generator circuit 2 depicted in FIG. 4. However, an alternative is to use the current generator circuit 1 depicted in FIG. 1 or the current generator circuit 3 depicted in FIG. 7. Further, the configuration depicted in FIG. 11 is described in conjunction with a method of inputting the reference clock used for the communication device 60 to the reference clock input section 700. However, the reference clock used for the display device 50 may alternatively be inputted to the reference clock input section 700. Still alternatively, a dedicated reference clock generator circuit for generating the reference clock to be inputted to the reference clock input section 700 may be disposed in the interior space 20.

The present invention is not limited to the foregoing embodiments, but includes various modifications. For example, the foregoing embodiments are described in detail in order to facilitate the understanding of the present invention. The present invention is not necessarily limited to a configuration that includes all the above-described elements. Further, some elements of an embodiment may be replaced by the elements of another embodiment, and some elements of an embodiment may be added to the elements of another embodiment. Furthermore, some elements of each embodiment may be subjected to the addition of other elements, deleted, or replaced by other elements. Comparative calculations depicted in the flowcharts are illustrative and not restrictive. Moreover, for example, the above-described elements, functions, processing sections, and processing means may be partly or wholly implemented by hardware, for example, by making a design with one integrated circuit, or implemented by using a plurality of integrated circuits.

DESCRIPTION OF REFERENCE CHARACTERS

100: Reference current source
200: Current mirror circuit
300: Adjustment register
400: Selector switch
500: Functional circuit
600: Diagnostic circuit
610: Oscillator
620, 630: Comparator
640: Initial value storage section
650: Register adjustment section
700: Reference clock input section

The invention claimed is:
1. A current generator circuit comprising:
 a functional circuit that uses a reference current;
 a diagnostic circuit that diagnoses the reference current, the reference current flowing through the functional circuit, in accordance with a result of a comparison between a period of a periodic signal generated based on the reference current and a period of a reference clock inputted from an outside;
 wherein the result of the comparison includes a first comparison result and a second comparison result, the first comparison result and the second comparison result being obtained at different time points, the diagnostic circuit diagnoses the reference current in accordance with a third comparison result that is obtained from a comparison between the first comparison result and the second comparison result, and the third comparison result is a difference between the first comparison result and the second comparison result.

2. The current generator circuit according to claim 1, wherein
the first comparison result is an initial value obtained when the functional circuit uses the reference current.

3. The current generator circuit according to claim 1, further comprising:
a current mirror circuit that generates the reference current.

4. The current generator circuit according to claim 3, wherein
the diagnostic circuit adjusts a mirror ratio of the current mirror circuit in accordance with the result of diagnosis of the reference current.

5. The current generator circuit according to claim 1, wherein
the functional circuit includes a calculation section that performs calculations based on the reference current, and
the diagnostic circuit adjusts a correction coefficient of the calculation section in accordance with the result of diagnosis of the reference current.

6. The current generator circuit according to claim 1, further comprising:
a selector switch that switches the input destination of the reference current between the functional circuit and the diagnostic circuit.

7. The current generator circuit according to claim 6, wherein
the selector switch switches the input destination of the reference current to the functional circuit when the functional circuit uses the reference current, and switches the input destination of the reference current to the diagnostic circuit when the result of comparison is to be produced.

8. The current generator circuit according to claim 1, wherein
a plurality of units of the functional circuit are disposed,
the reference current is generated for each of the plurality of units of the functional circuit,
the diagnostic circuit is shared by the plurality of units of the functional circuit, and
the selector switch is disposed for each of the plurality of units of the functional circuit and adapted to sequentially switch the input destination of the reference current from the functional circuit to the diagnostic circuit in a manner that the reference currents of the plurality of units of the functional circuit are sequentially inputted to the diagnostic circuit.

9. The current generator circuit according to claim 8, wherein
the diagnostic circuit makes individual adjustments to equalize the reference currents used in the plurality of units of the functional circuit.

10. The current generator circuit according to claim 1, wherein
an oscillation source of the reference clock is installed in an environment where the oscillation source receives lower thermal stress than a current source of the reference current.

11. The current generator circuit according to claim 1, wherein
the diagnostic circuit is inoperative at an ambient temperature outside a predetermined range.

12. The current generator circuit according to claim 1, wherein
the functional circuit includes
a solenoid driver that drives a solenoid, and
a detector that detects a drive current outputted from the solenoid driver, and
the diagnostic circuit adjusts a coefficient used for calculation by the detector in a manner that the drive current outputted from the solenoid driver coincides with a value detected by the detector.

13. A diagnostic circuit comprising:
a first comparator that compares a period of a periodic signal generated based on a current used in an electronic circuit and a period of a reference clock inputted from an outside;
an adjustment section that adjusts the current in accordance with a result of comparison made by the first comparator,
an oscillator that generates the periodic signal based on the current used in the electronic circuit;
a storage section that stores a result of a comparison made at a first time point by the first comparator; and
a second comparator that compares the result of the comparison made at the first time point and a result of a comparison made at a second time point by the first comparator and outputs a difference between them;
wherein the adjustment section adjusts the current in accordance with a result of a comparison made by the second comparator.

* * * * *